United States Patent
Su et al.

(10) Patent No.: US 10,219,402 B1
(45) Date of Patent: Feb. 26, 2019

(54) TO EXPAND PANEL PORT NUMBER (71) Applicant: QUANTA COMPUTER INC., Taoyuan (TW)

(72) Inventors: Chin-Lung Su, Taoyuan (TW); Chih-Chung Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/960,939

(22) Filed: Apr. 24, 2018

Related U.S. Application Data (60) Provisional application No. 62/623,718, filed on Jan. 30, 2018.

(51) Int. Cl.
*H05K 7/20* (2006.01)
*H05K 7/14* (2006.01)
*G06F 1/20* (2006.01)

(52) U.S. Cl.
CPC ............ *H05K 7/1491* (2013.01); *G06F 1/20* (2013.01); *H05K 7/1487* (2013.01); *H05K 7/20709* (2013.01)

(58) Field of Classification Search
CPC .. H05K 7/1435; H05K 7/1488; H05K 7/1489; H05K 7/1491
See application file for complete search history.

(56) References Cited

U.S. PATENT DOCUMENTS

| | | | | |
|---|---|---|---|---|
| 8,379,410 B2* | 2/2013 | Kitten | ............... | H05K 7/1491 174/69 |
| 9,025,326 B1* | 5/2015 | Xu | ............ | H05K 7/1487 361/679.37 |
| 9,538,684 B2* | 1/2017 | Chen | ................. | H05K 7/1489 |
| 9,844,163 B2* | 12/2017 | Zhu | ............ | H05K 7/1487 |
| 2003/0039099 A1* | 2/2003 | Chen | ................ | G06F 1/181 361/727 |
| 2004/0223311 A1* | 11/2004 | Lee | ............ | H05K 7/1425 361/826 |
| 2007/0227756 A1* | 10/2007 | Doerr | ................ | H05K 7/1491 174/69 |
| 2008/0205028 A1* | 8/2008 | Papakos | ............ | H05K 7/1425 361/826 |
| 2010/0027213 A1* | 2/2010 | Wu | ................ | G06F 1/184 361/679.39 |
| 2013/0301225 A1* | 11/2013 | Gong | ................ | H05K 7/1491 361/729 |
| 2015/0043146 A1* | 2/2015 | Li | ............ | H05K 7/1487 361/679.31 |
| 2017/0245390 A1* | 8/2017 | Larson | ............ | H05K 7/1492 |

* cited by examiner

*Primary Examiner* — Anthony Q Edwards
(74) *Attorney, Agent, or Firm* — Nixon Peabody LLP; Eduardo J. Quiñones; Zhou Lu (57) ABSTRACT

A computing device is provided. The computing device includes a first and second housing. The first housing includes a first and second set of electrical connection ports. The first set of electrical connection ports is positioned at a first location and in a first orientation. The second set of electrical connection ports is positioned at a second location and in a second orientation, which is different from the first set of electrical connection ports. The second housing is fixed within the computing device. The first housing is slidable, with respect to the second housing, within the computing device to enable access to the second set of electrical connection ports.

20 Claims, 7 Drawing Sheets

TO EXPAND PANEL PORT NUMBER

CROSS REFERENCE TO RELATED APPLICATIONS

This application claims priority to and the benefit of U.S. Provisional Application No. 62/623,718, entitled "A DESIGN TO EXPAND PANEL PORT NUMBER" and filed on Jan. 30, 2018, the contents of which are hereby incorporated by reference in their entirety as if fully set forth herein.

FIELD OF THE INVENTION

This application relates to a server device with multiple locations for I/O ports to provide increased functionality.

BACKGROUND

The emergence of the cloud for computing applications has increased the demand for off-site installations, known as data centers. These data centers store data and run applications accessed by remotely connected computer device users. Such data centers typically have massive numbers of servers, switches, and storage devices to store and manage data, so they may be accessed in a convenient manner by remote computer users. Typically, a data center has physical rack structures with attendant power and communication connections. The racks are arranged in rows throughout the room or rooms of the data center. Each rack includes a frame that has vertically oriented slots or chassis that may hold multiple devices such as servers, switches and storage devices. There are many such devices stacked in such rack structures found in a modern data center. For example, some data centers have tens of thousands of servers and attendant storage devices and network switches. Thus, a typical data center may include tens of thousands, or even hundreds of thousands, of devices in hundreds or thousands of individual racks.

Figure 1:
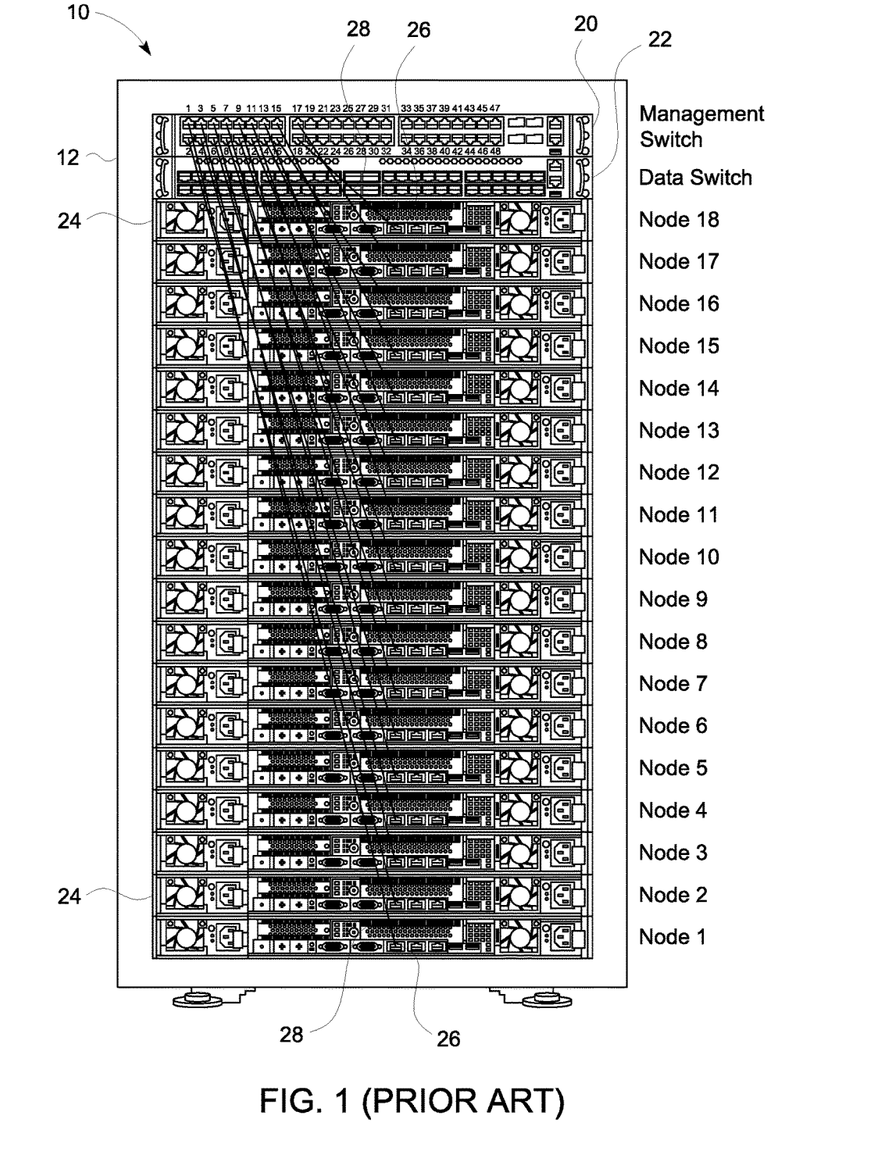
FIG. 1 shows a prior art equipment rack in a data center exemplifying a management switch and a data switch connected to a plurality of server devices.

A typical rack 10 is shown in FIG. 1. The rack 10 includes a frame 12 having a set number of slots, twenty in this example. The top two slots of the frame 12 hold a management switch 20 and a data switch 22. Each of the slots has an associated circuit board (not shown) that allows for connection of different devices in the slot. As may be seen in FIG. 1, the management switch 20 and the data switch 22 each have a number of ports to allow the connection to other devices held by the frame 12. In this example, the remaining 18 slots of the frame 12 hold identical servers 24. Each of the servers 24 have a management port 26 that is connected by a cable 28 to one of the ports on the management switch 20. Other ports may be connected to the data switch 22 (such cables have been omitted from FIG. 1 for clarity).

As may be seen in FIG. 1, the nodes represented by the servers 24 in the network correspond to the number of the physical slots. As performance demands increase, the number of servers 24 installed within the frame 12 will also increase. As a result, the management switch 20 and the data switch 22 will need to be reconfigured to accommodate this increased demand.

SUMMARY

The following presents a simplified summary of one or more embodiments in order to provide a basic understanding of present technology. This summary is not an extensive overview of all contemplated embodiments of the present technology, and is intended to neither identify key or critical elements of all examples, nor delineate the scope of any or all aspects of the present technology. Its sole purpose is to present some concepts of one or more examples in a simplified form as a prelude to the more detailed description that is presented later.

A computing device is provided. The computing device includes a first and second housing. The first housing can include a single set of electrical connection ports. In some embodiments, the first housing can include two sets of the electrical connection ports first set located on front side, the second set located within inner of first housing to create side channel. The side channel can be configured to receive air flow and cable. The angle between first set and second set connection port can be between 90 and 180 degree. Moreover, in some embodiments, the first housing can include a first, second, and third set of electrical connection ports. The second and third sets of electrical connection ports can be positioned within the inner of the first housing to create side channels. The side channels can be configured to receive air flow and cable. The side channels can also be access locations to the second and third sets of electrical connection ports.

In some embodiments, the second and third set of electrical ports are positioned perpendicular to the first set of electrical connection ports. In other words, the angle between the first electrical connection port and the second electrical port can be 90-degrees. In alternative embodiments, the angle between the first set of electrical connection port and the second set of electrical connection ports can be between 90- and 180-degrees. Similarly, the angle between the first electrical connection port and the third electrical port can be 90-degrees. Furthermore, the angle between the first set of electrical connection port and the second set of electrical connection ports can be between 90- and 180-degrees. In some embodiments, the first set of electrical connection ports may not be straight, for example, the first set of electrical connection ports may be oriented as a curve.

In some embodiments, the electrical ports include I/O connectors. In some embodiments, the computing device includes vent holes located at the first, second and third set of electrical connection ports. The vent holes can be configured to receive airflow to cool the computing device.

The first housing can also include a chipset. In some embodiments, two sets of electrical connection ports are located on opposite sides of the chipset. A microprocessor can be connected to the chipset. The second housing can also include power supply units. Moreover, the second housing can include fan modules. In some embodiments, the computing device also includes extendable electrical connections. The extendable electrical connections can be configured to connect electrical components on the second housing to a microprocessor on the first housing. Also, the extendable electrical connections can connect PSUs on the second housing to a PCB of the first housing in order to provide power to components on the first housing.

A server rack is disclosed herein. The server rack includes a plurality of server devices connected to the computing device. As indicated above, the computing device includes a first and second housing. The first housing can include a single set of electrical connection ports. In some embodiments, the first housing can include two sets of the electrical connection ports located on opposing sides. Moreover, in some embodiments, the first housing can include a first, second, and third set of electrical connection ports. The second and third sets of electrical connection ports can be positioned within the inner of the first housing to create side channels. The side channels can be configured to receive air flow and cable. The side channels can also be access locations to the second and third sets of electrical connection ports.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings. The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims. The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In general, one implementation of the subject matter disclosed herein is directed to a computing device with multiple locations for I/O ports to provide increased functionality. In one or more embodiments, the computing device includes a first and second housing. The first housing includes a first, second, and third set of electrical connection ports. The second and third set of electrical ports are positioned perpendicular to the first set of electrical connection ports. The second housing is fixed within the computing device. The first housing is slidable with respect to the second housing within the computing device to enable access to the second and third set of electrical ports.

Figure 2A:
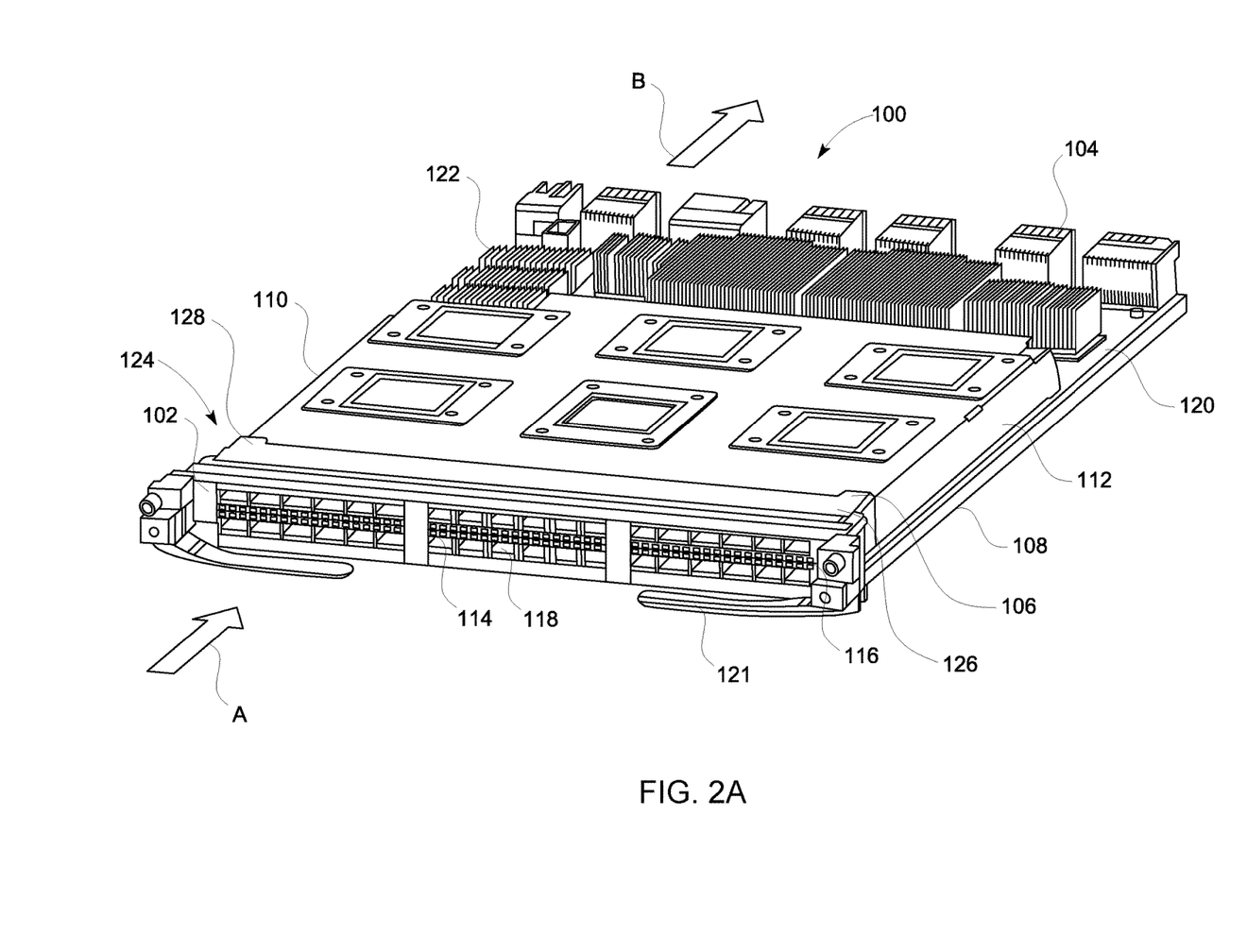
FIG. 2A shows a perspective view of a prior art computer device, exemplified without a cover to illustrate the internal components.
Figure 2B:
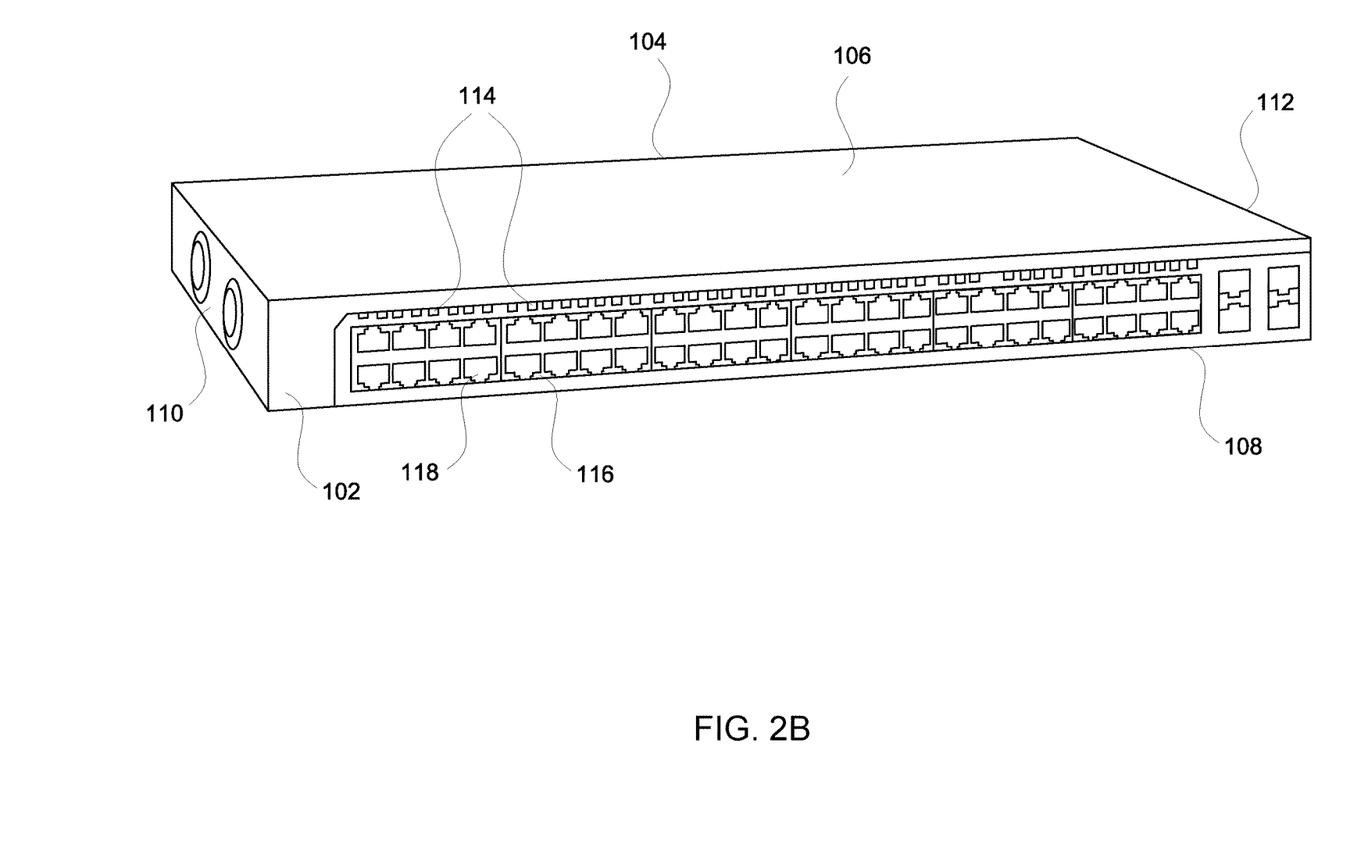
FIG. 2B shows a perspective view of a prior art computer device, exemplified with a cover.

FIG. 2A illustrates a perspective view of a switch 100 of the prior art. The switch 100 may be one of a plurality of switches stacked in and supported by a chassis (not shown). For example, switch 100 can serve as the management switch 20 or the data switch 22 within the frame 12 of FIG. 1. The switch 100 includes a front 102, a back 104, a top 106, a bottom 108, a first side 110, and a second side 112. The switch 100 does not include a cover, as the chassis may act as a cover when the switch 100 is installed in the chassis. In another embodiment shown in FIG. 2B, the switch 100 includes a cover that surrounds any combination of the front 102, the back 104, the top 106, the bottom 108, the first side 110, and the second side 112.

Referring back to FIG. 2A, the front 102 of the switch 100 includes a plurality of openings 114 (e.g., vent holes) through which airflow A can flow to cool the switch 100. The front 102 also includes a plurality of openings 116 for corresponding I/O connectors 118, for example.

In some embodiments, the switch 100 includes any number of components including, for example, the I/O connectors 118, a plurality of heat generating electrical hardware components 120, a plurality of fans (not shown), a plurality of baffles (not shown) corresponding with the fans, and other thermal management components (e.g., heat pipes). The I/O connectors 118, the plurality of heat generating electrical hardware components, the plurality of fans, the plurality of baffles, the other thermal management components, or a combination thereof may be supported by and/or attached to the bottom 108 of the switch 100. The various components, or a combination thereof, can be attached to the bottom 108 by using an adhesive, screws, nut/bolt combinations, snaps, mated press fittings, other attachment devices, or a combination thereof. The switch 100 may include different, additional, or fewer components. For example, the switch 100 can include one or more rotatable levers 121 operable to lock the switch 100 in the chassis.

The I/O connectors 118 may be any number of I/O connectors 118 including, for example, RJ45 connectors, SFP connectors, QSFP connectors or OSFP connectors. The I/O connectors 118 may be used for input only, output only, or both input and output connections.

The plurality of heat generating electric hardware components 120 may include heat sinks 122 to aid in the transfer of heat from the plurality of heat generating electric hardware components 120 to the surrounding air. The plurality of heat generating electric hardware components 120 may include, for example, processors, circuits, transistors, memory devices, power supplies, transformers, chips, integrated circuits, or other electronics.

The fans pull or push (e.g., depending on the direction the plurality of fans are positioned within the switch 100) air into or out of the plurality of openings 114. In one embodiment, air is pulled into the switch 100 through the plurality of openings 114 in the direction of arrow A. At least a portion of the air is pushed out of the switch 100 at the back 104, as indicated by arrow B. In another embodiment, the flow of air is reversed, as air is pulled into the switch 100 at the back 104, and pushed out of the switch 100 through the plurality of openings 114 at the front 102.

The front 102 of the switch 100 may be formed by a faceplate 124. The faceplate 124 includes the plurality of openings 114 for airflow A and the plurality of openings 116 for the I/O connectors 118.

The plurality of openings 114 are provided for thermal management purposes. Depending on the number of I/O connectors 118, and thus the size of the openings 116 provided for the I/O connectors 118 of the switch 100, there may be little space remaining for placement of the plurality of openings 114. Thus, there is a tradeoff between the number of plurality of openings 114 and the number of I/O connectors 118. For example, the more I/O connectors 118 present within the faceplate 124, the less space is available within the faceplate 124 for vent holes. Conversely, one can provide more vent holes, as indicated in FIG. 2A, but lose space for the I/O connectors 118. Additionally, the increased surface area allows for a greater spacing between components, which can also facilitate cooling.

For high power consumption switches or line cards, temperatures of one or more of the heat generating electrical hardware components during operation of the switch may be too great, without sufficient airflow through the switch or line card, to cool the heat generating electrical hardware components. The switch or line card may not operate properly and/or may shut down with such high temperatures. If the openings 114 are made too large and/or positioned too close together, the openings 114 may cause electro-magnetic interference and/or structural integrity issues.

Figure 3:
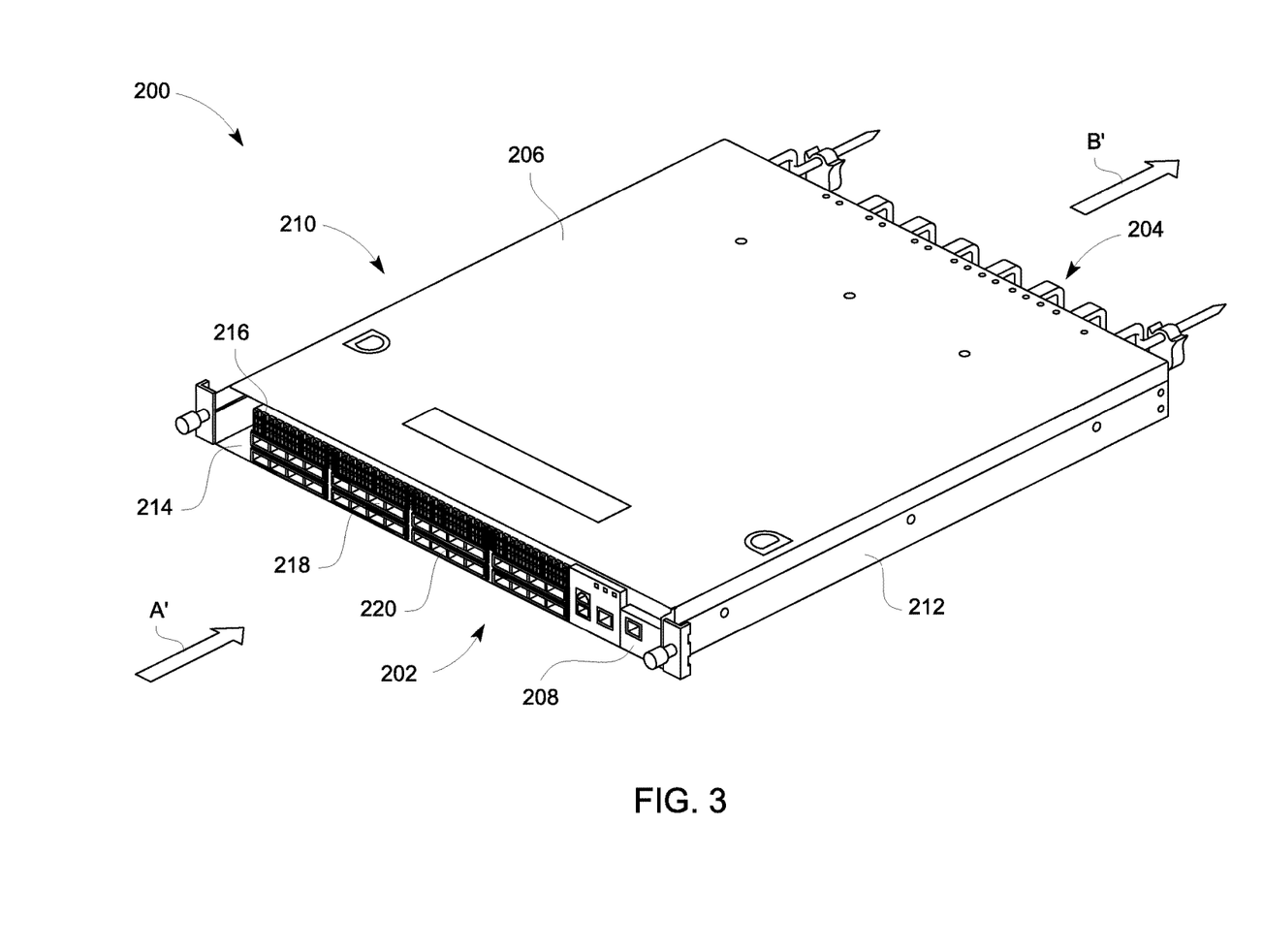
FIG. 3 shows a perspective view of a computing device implementing multiple side channels, exemplified with a cover according to one or more embodiments of the disclosure.

FIG. 3 illustrates a perspective view of one embodiment of a switch 200. The switch 200 includes a front 202, a back 204, a top 206, a first side 210, and a second side 212. The front 202 of the switch 200 can include a plurality of openings 216 (e.g., vent holes) through which air used to cool the switch 200 flows. The front 202 also includes a plurality of openings 220 for corresponding I/O connectors 218. The plurality of openings 216 and the plurality of openings 220 for corresponding I/O connectors 218 can be centered on the front 202 of the switch 200. The I/O connectors 218 may be any number of I/O connectors including, for example, RJ45 connectors, SFP connectors, QSFP connectors or OSFP connectors. The I/O connectors 218 may be used for input only, output only, or both input and output connections.

The front 202 of the switch 200 can also include a first side channel 214 located on the left side of the plurality of openings 216 and 220. In addition, the front 202 of the switch 200 can include a second side channel 208 located on the right side of the plurality of openings 216 and 220. The first and second side channels 214 and 208 are access paths to a second and third set of plurality of openings for corresponding I/O connectors (not shown). The first and second side channels 214 and 208 can allow for cable housing to the I/O connectors. In addition, the first and second side channels 214 and 208 can allow for additional air flow to reach the additional I/O connectors. This is discussed in greater detail below with respect to FIG. 4.

Figure 4:
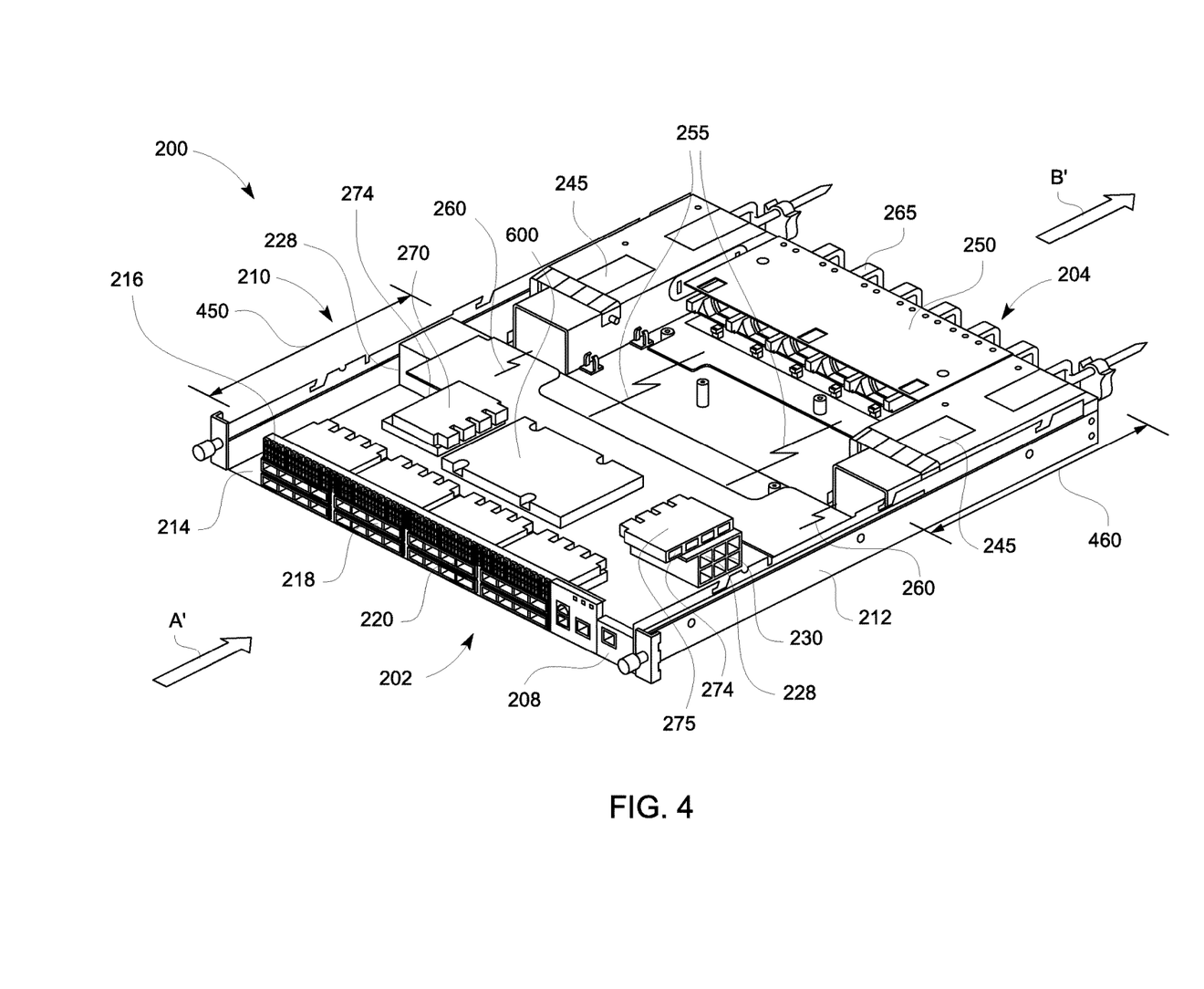
FIG. 4 shows a perspective view of the computing device of FIG. 3, exemplified without a cover to illustrate the internal components according to one or more embodiments of the disclosure.

FIG. 4 illustrates a perspective view of one embodiment of the switch 200 without a cover to illustrate the internal components. The switch 200 includes a first section 450 and a second section 460. The first section 450 houses the plurality of openings 216 through which airflow A enters the front 202 to cool the switch 200. The first section 450 also includes a plurality of openings 220 for corresponding I/O connectors 218. In some embodiments, the switch 200 can include thirty-two openings 220 and thirty-two corresponding I/O connectors 218.

In some embodiments, the first section 450 can solely house a single set of I/O connectors 218. In alternative embodiments, the first section 450 can include two sets of the electrical connection ports located on opposing sides of the computing device. For example, the first section 450 can include the set of I/O connectors 218 and a first set of connectors 270. The first connector 270 can include a plurality of openings for corresponding I/O connectors (not shown). Alternatively, the first section 450 can include the set of I/O connectors 218 and a second set of connectors 275. The second set of connector 275 can include a plurality of openings 230 for I/O connectors 228.

Moreover, in some embodiments, the first section 450 can include a first, second, and third set of electrical connection ports. For example, the first section 450 can include the I/O connectors 218, and the first and second set of connectors 270 and 275. The first and second set of connectors 270 and 275 can include I/O connectors 228.

The first and second set of connectors 270 and 275 can be positioned within the first section 450 to create side channels. The first section 450 can include a first side channel 214 leading to the first connector 270. The first section 450 can include a second side channel 208 leading to a second connector 275.

In some embodiments, an angle between the I/O connectors 218 and the first set of connectors 270 can be 90-degrees. In alternative embodiments, an angle between the I/O connectors 218 and the first second set of connectors 270 can be between 90- and 180-degrees. Similarly, an angle between the I/O connectors 218 and the second set of connectors 275 can be 90-degrees. Furthermore, an angle between the I/O connectors 218 and the second set of connectors 275 can be between 90- and 180-degrees. In some embodiments, the I/O connectors 218 may not be straight, for example, the I/O connectors 218 may be oriented as a curve.

In some examples, the first set of I/O connectors 228 can include eight I/O connectors. Accordingly, the second set of I/O connectors 228 can also include eight I/O connectors. Similar to the I/O connectors 218, the I/O connectors 228 can be any number of I/O connectors including, for example, RJ45 connectors, SFP connectors, QSFP connectors or OSFP connectors. The I/O connectors 218 can be used for input only, output only, or both input and output connections.

The first connector 270 and the second connector 275 can also include a plurality of openings 274 (e.g., vent holes) through which air used to cool the switch 200 flows. The plurality of openings 274 and 216 are provided for thermal management purposes. The placement of the plurality of openings 274 and 216 provides a design advantage over the conventional design. In the conventional switch of FIGS. 2A and 2B, there is little space remaining for the placement of the plurality of openings 114 due to the number of I/O connectors 118 and the size of the openings 116 provided for the I/O connectors 118. For example, the more I/O connectors 118 present, the less space is available within the switch 100 for vent holes. However, because the present embodiment does not restrict the plurality of openings 274 and 216 to the faceplate of the switch 200, the switch 200 has an increased surface area. This increased surface area allows for a greater spacing between components, which also facilitates cooling.

The first section 450 of the switch 200 can also include a chipset 600. The chipset 600 can include switches (not shown) and a microprocessor and companion chip (not shown). As shown, the chipset 600 is arranged to support ports associated I/O connectors 218 and 228. The I/O connectors 218 are located on one side of the chipset 600, and the I/O connectors 228 are located adjacent to the I/O connectors 218. Specifically, a first set of I/O connectors 228 are located on side 212 of the switch 200, and a second set of I/O connectors 228 are located on side 210 of the switch 200. This allows for improved signal integrity as the I/O connectors 218 and 228 are positioned closer to the chipset 600, in comparison to the conventional switch shown in FIGS. 2A and 2B.

The second section 460 of the switch 200 can include power supply units 245, a plurality of fan modules 250, and a plurality of I/O interfaces 265. The plurality of fan modules 250 pull or push (e.g., depending on the direction the plurality of fans are positioned within the switch 200) air into or out of the plurality of openings 216 and 274. In one embodiment, air is pulled into the switch 200 through the plurality of openings 216 and 274 in the direction of arrow A. At least a portion of the air is pushed out of the switch 200 at the back 204, as indicated by arrow B. In another embodiment, the flow of air is reversed, as air is pulled into the switch 200 at the back 204, and pushed out of the switch 200 through the plurality of openings 216 and 274. The plurality of I/O interfaces 265 enable connection to external peripheral devices (not shown).

The cables 255 and 260 are provided to enable electrical connection between the chipset 600, I/O connectors 218, 228, the power supply units 245, and the plurality of I/O interfaces 265 and plurality of fan module 250. Specifically, the components housed on the first section 450 can be connected to the power supply units 245 by cable connector 260. Furthermore, the I/O connectors 218 and 228 can be connected to the I/O interfaces 265 by cable connector 255. Fan speed and control signal of fan module 250 also connect to chipset 600 by cable 255. The cables 255 and 260 are configured to stretch to allow for an extended connection between the chipset 600, I/O connectors 218, 228, the power supply units 245, and the plurality of I/O interfaces 265. This is discussed in greater detail below with respect to FIGS. 5 and 6. It should be noted that the switch 200 may include different, additional, or fewer components.

Figure 5:
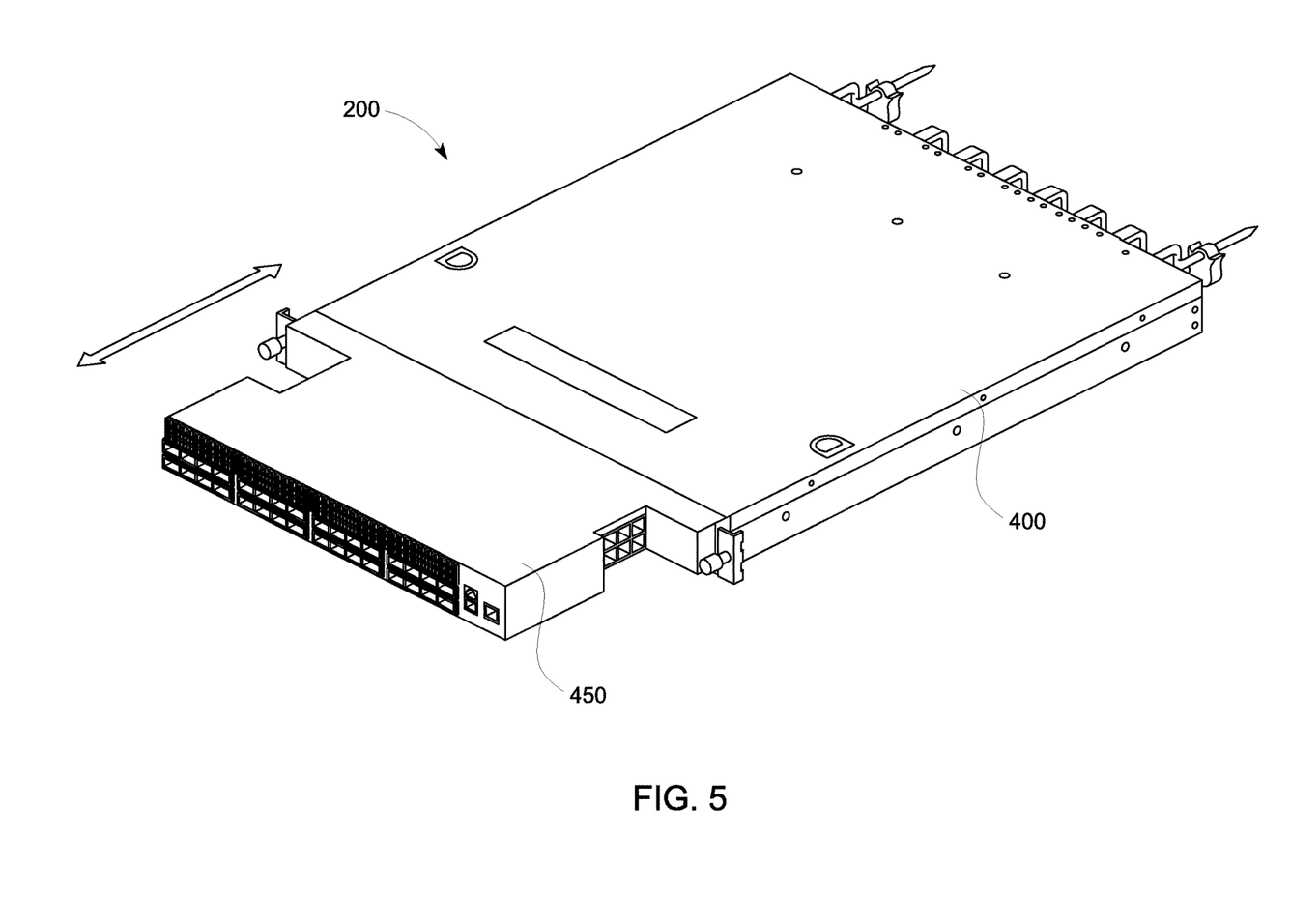
FIG. 5 shows a perspective view of the computing device of FIG. 3, exemplified in installation mode to illustrate access to the side channels according to one or more embodiments of the disclosure.
Figure 6:
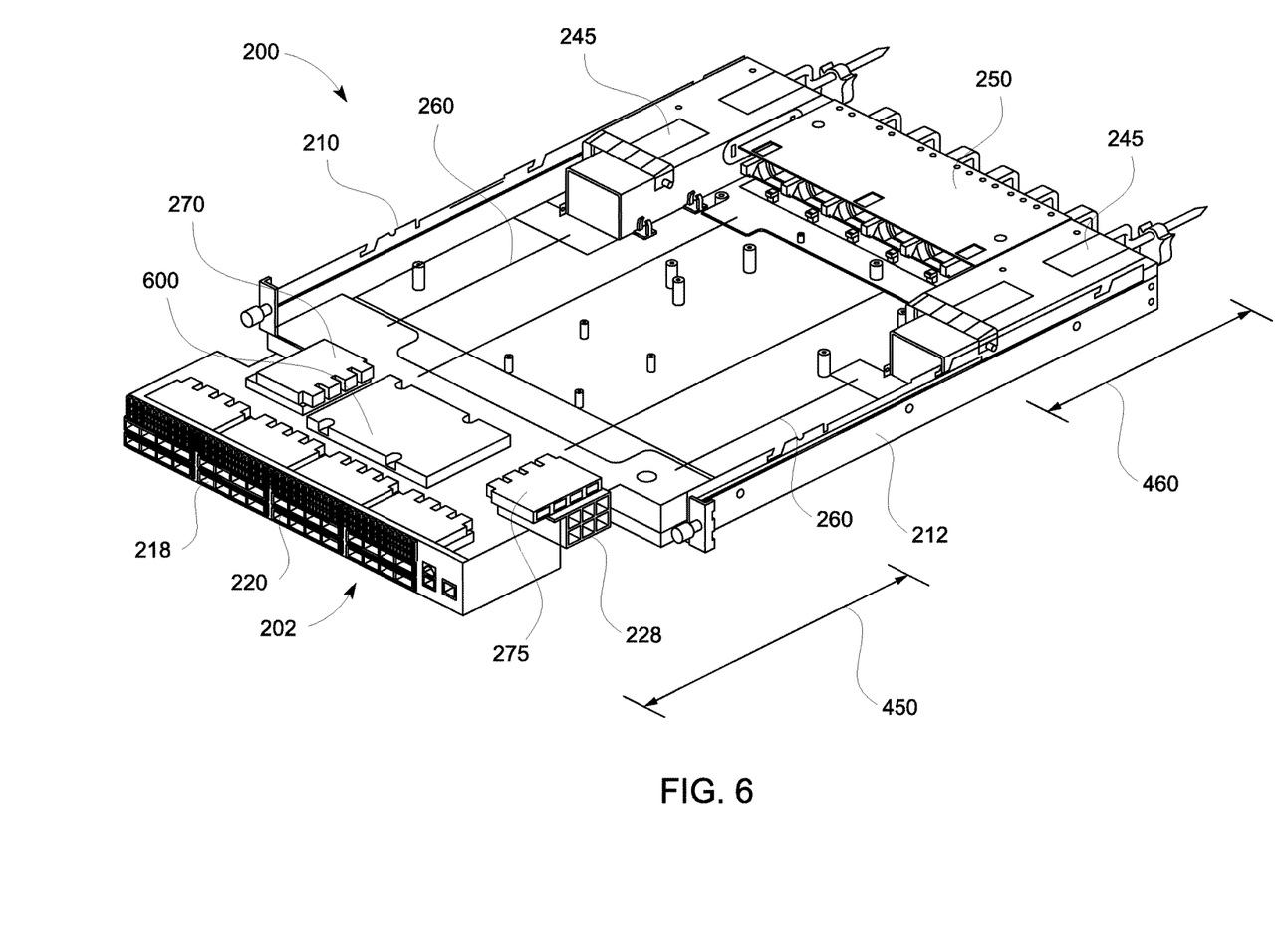
FIG. 6 shows a perspective view of the computing device of FIG. 5, exemplified without a cover to illustrate the internal components according to one or more embodiments of the disclosure.

FIG. 5 shows a perspective view of the switch 200, illustrated in an installation mode to illustrate access to the side channels 214 and 208 (from FIG. 4). FIG. 6 shows a perspective view of the switch 200 without a cover, illustrated in the installation mode. The first section 450 of the switch can be configured to slide in and out of the switch 200 to allow access to the first connector 270 and the second connector 275, and subsequently the I/O connectors 228. The second section 460 can be fixed in place within the switch 200. For example, the second section 460 and all of its components may be supported by and/or attached to the interior base of the switch 200. The various components, or a combination thereof, can be attached to the interior base by using an adhesive, screws, nut/bolt combinations, snaps, mated press fittings, other attachment devices, or a combination thereof.

In contrast, the first section 450 can include a separate base section from that of the switch 200. This separate base section can be configured to slide in and out of the switch 200 on a pair of tracks positioned on the inner walls of the switch 200. For example, the first side 210 can include an interior wall that includes a track (now shown) that is configured to connect to a corresponding track of the first section 450. A similar feature can be present on the second wall 212. This allows the first section 450 to be pulled in and out of the switch 200 by an administrator to access the first connector 270 and the second connector 275, and subsequently the I/O connectors 228. FIGS. 3 and 4 show the switch 200 in the normal operation mode, where the first and second sections 450 and 460 are located near one another. In the normal operation mode, the cables 255 and 260 are not extended as the first section 450 is within the housing of the switch 200. FIGS. 6 and 5 show the switch 200 in the installation mode. In the installation mode, the first section 450 is extended out of the housing of the switch 200. This causes the cables 255 and 260 to extend to maintain connection between the chipset 600, I/O connectors 218, 228, the power supply units 245, and the plurality of I/O interfaces 265 and fan speed and fan control signal of fan module 250.

While various embodiments of the present invention have been described above, it should be understood that they have been presented by way of example only, and not limitation. Numerous changes to the disclosed embodiments can be made in accordance with this disclosure without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more embodiments, equivalent alterations, and modifications will occur to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing device, comprising:
   a first housing comprising a first set of electrical connection ports at a first location and in a first orientation and a second set of electrical connection ports at a second location and in a second orientation, wherein the first and second location and orientation are different; and
   a second housing fixed within the computing device, wherein the first housing is slidable with respect to the second housing within the computing device to enable access to the second set of electrical connection ports.

2. The computing device of claim 1, further comprising extendable electrical connections configured to connect electrical components stored on the second housing to the first and second set of electrical connection ports.

3. The computing device of claim 1, wherein the electrical connection ports comprise I/O connectors.

4. The computing device of claim 1, wherein the second set of electrical connection ports is oriented at a first side channel within the first housing, wherein the first side channel is configured for air flow and cable.

5. The computing device of claim 1, wherein an angle between the first set of electrical connection ports and the second set of electrical connection ports is 90-degrees.

6. The computing device of claim 1, wherein an angle between the first set of electrical connection ports and the second set of electrical connection ports is between 90-degrees and 180-degrees.

7. The computing device of claim 1, further comprising a third set of electrical connection ports at a third location and in a third orientation, wherein the third set of electrical connection ports are located on an opposite side of the computing device with respect to the second set of electrical connection ports.

8. The computing device of claim 7, further comprising a chipset located at the first housing, wherein the second and third set of electrical connection ports are located on opposite sides of the chipset, and the first set of electrical connection ports is located adjacent to the second and third set of electrical connection ports.

9. The computing device of claim 7, wherein an angle between the first set of electrical connection ports and the third set of electrical connection ports is 90-degrees.

10. The computing device of claim 7, wherein an angle between the first set of electrical connection ports and the third set of electrical connection ports is between 90-degrees and 180-degrees.

11. The computing device of claim 7, wherein the third set of electrical connection ports is oriented at a second side channel within the first housing, wherein the second side channel is configured for air flow and cable.

12. A server rack comprising:
    a plurality of server devices; and
    a computing device comprising:
       a first housing comprising a first set of electrical connection ports at a first location and in a first orientation and a second set of electrical connection ports at a second location and in a second orientation, wherein the first and second location and orientation are different; and
       a second housing fixed within the computing device, wherein the first housing is slidable with respect to the second housing within the computing device to enable access to the second set of electrical connection ports.

13. The rack server of claim 12, further comprising extendable electrical connections configured to connect electrical components stored on the second housing to the first and second set of electrical connection ports.

14. The rack server of claim 12, wherein the second set of electrical connection ports is oriented at a first side channel within the first housing, wherein the first side channel is configured for air flow and cable.

15. The rack server of claim 12, wherein an angle between the first set of electrical connection ports and the second set of electrical connection ports is 90-degrees.

16. The rack server of claim 12, wherein an angle between the first set of electrical connection ports and the second set of electrical connection ports is between 90-degrees and 180-degrees.

17. The rack server of claim 12, further comprising a third set of electrical connection ports at a third location and in a third orientation, wherein the third set of electrical connection ports are located on an opposite side of the computing device with respect to the second set of electrical connection ports.

18. The rack server of claim 17, wherein an angle between the first set of electrical connection ports and the third set of electrical connection ports is 90-degrees.

19. The rack server of claim 17, wherein an angle between the first set of electrical connection ports and the third set of electrical connection ports is between 90-degrees and 180-degrees.

20. The rack server of claim 17, wherein the third set of electrical connection ports is oriented at a second side channel within the first housing, wherein the second side channel is configured for air flow and cable.

* * * * *